(12) United States Patent
Kim et al.

(10) Patent No.: US 10,305,018 B2
(45) Date of Patent: May 28, 2019

(54) MANUFACTURING METHOD OF ELECTRONIC COMPONENT

(71) Applicant: SAMSUNG ELECTRO-MECHANICS CO., LTD., Suwon-si, Gyeonggi-do (KR)

(72) Inventors: Jeong Ryeol Kim, Suwon-si (KR); Bum Suk Kang, Suwon-si (KR); Hyo Min Kang, Suwon-si (KR); Hang Kyu Cho, Suwon-si (KR); Chang Hoon Kim, Suwon-si (KR)

(73) Assignee: SAMSUNG ELECTRO-MECHANICS CO, LTD., Suwon-si, Gyeonggi-do (KR)

( * ) Notice: Subject to any disclaimer, the term of this patent is extended or adjusted under 35 U.S.C. 154(b) by 111 days.

(21) Appl. No.: 15/291,794

(22) Filed: Oct. 12, 2016

(65) Prior Publication Data
US 2017/0244023 A1    Aug. 24, 2017

(30) Foreign Application Priority Data
Feb. 24, 2016    (KR) .......................... 10-2016-0021743

(51) Int. Cl.
*H01G 4/12*     (2006.01)
*H01L 41/047*   (2006.01)
(Continued)

(52) U.S. Cl.
CPC ......... *H01L 41/0478* (2013.01); *H01C 1/148* (2013.01); *H01C 7/008* (2013.01);
(Continued)

(58) Field of Classification Search
CPC ...... H01C 17/28; H01C 17/283; H01C 1/148; H01C 7/008; H01C 7/10; H01C 7/1006;
(Continued)

(56) References Cited

U.S. PATENT DOCUMENTS 4,307,147 A * 12/1981 Ohishi ................ H01L 23/3737
257/E23.107
6,362,947 B1 * 3/2002 Chazono ................. H01G 4/30
29/25.42
(Continued)

FOREIGN PATENT DOCUMENTS

KR    10-2009-0086355 A    8/2009
KR    10-2014-0067477 A    6/2014
(Continued)

*Primary Examiner* — Minh Trinh
(74) *Attorney, Agent, or Firm* — Morgan Lewis & Bockius LLP

(57) ABSTRACT

A manufacturing method of an electronic component includes forming a body including first and second internal electrodes respectively exposed from first and second end surfaces of the body and dielectric layers disposed between the first and second internal electrodes; applying, on the first and second end surfaces of the body, a paste containing a metal powder and first glass; and sintering the body and the paste to convert the paste to first and second external electrodes including crystalline metal particles having a polyhedral shape and second glass and respectively connected to the first internal electrodes and the second internal electrodes

8 Claims, 2 Drawing Sheets

(51) Int. Cl.
*H01C 7/00* (2006.01)
*H01C 7/10* (2006.01)
*H01C 17/28* (2006.01)
*H01F 27/28* (2006.01)
*H01F 27/29* (2006.01)
*H01F 37/00* (2006.01)
*H01F 41/10* (2006.01)
*H01G 4/008* (2006.01)
*H01G 4/30* (2006.01)
*H01L 41/273* (2013.01)
*H01C 1/148* (2006.01)
*H01C 7/18* (2006.01)
*H01G 4/232* (2006.01)
*H01L 41/293* (2013.01)
*H01F 17/00* (2006.01)

(52) U.S. Cl.
CPC ............... H01C 7/10 (2013.01); H01C 7/18 (2013.01); H01C 17/28 (2013.01); H01C 17/283 (2013.01); H01F 27/2847 (2013.01); H01F 27/29 (2013.01); H01F 37/005 (2013.01); H01F 41/10 (2013.01); H01G 4/008 (2013.01); H01G 4/2325 (2013.01); H01G 4/30 (2013.01); H01L 41/0472 (2013.01); H01L 41/0477 (2013.01); H01L 41/273 (2013.01); H01L 41/293 (2013.01); *H01C 7/1006* (2013.01); *H01F 17/0006* (2013.01); *H01F 27/292* (2013.01); *H01G 4/12* (2013.01)

(58) Field of Classification Search
CPC ......... H01C 7/18; H01F 7/18; H01F 17/0006; H01F 27/2847; H01F 27/29
See application file for complete search history.

(56) References Cited

U.S. PATENT DOCUMENTS

| | | | | |
|---|---|---|---|---|
| 8,941,973 | B2* | 1/2015 | Kim | H01G 4/30 |
| | | | | 29/25.41 |
| 9,786,463 | B2* | 10/2017 | Aoyagi | H01B 1/22 |
| 2009/0199897 | A1 | 8/2009 | Naito et al. | |
| 2014/0146437 | A1 | 5/2014 | Lee et al. | |
| 2014/0268485 | A1 | 9/2014 | Kang et al. | |
| 2015/0014900 | A1* | 1/2015 | Lee | H01G 4/30 |
| | | | | 264/615 |
| 2015/0114701 | A1* | 4/2015 | Chung | H01G 4/12 |
| | | | | 174/260 |
| 2017/0008806 | A1* | 1/2017 | Yoon | C04B 35/49 |
| 2017/0244023 | A1* | 8/2017 | Kim | H01C 7/008 |
| 2018/0144863 | A1* | 5/2018 | Kim | C01B 31/043 |

FOREIGN PATENT DOCUMENTS

| | | |
|---|---|---|
| KR | 10-2014-0112881 A | 9/2014 |
| KR | 10-2015-0128309 A | 11/2015 |

\* cited by examiner

MANUFACTURING METHOD OF ELECTRONIC COMPONENT

CROSS-REFERENCE TO RELATED APPLICATION(S)

This application claims the benefit of priority to Korean Patent Application No. 10-2016-0021743, filed on Feb. 24, 2016 in the Korean Intellectual Property Office, the entirety of which is incorporated herein by reference.

TECHNICAL FIELD

The present disclosure relates to an electronic component and a manufacturing method thereof.

BACKGROUND

In general, electronic components using a ceramic material, such as capacitors, inductors, piezoelectric elements, varistors, thermistors, or the like, include a body formed of a ceramic material, internal electrodes formed in the body, and external electrodes installed on a surface or surfaces of the body to be connected to the internal electrodes.

Recently, as electronic products have been miniaturized and become more multifunctional, electronic components have also become more compact and multifunctional, and thus, there has been increase demand for an electronic component having thin external electrodes.

An external electrode may be formed by applying a paste for external electrode formation, wherein in the paste for an external electrode, metal particles such as copper (Cu) are used as the main material, and a glass material is used as an auxiliary material. Since the external electrode contain glass, a delamination or aggregation phenomenon of the glass may occur, and thus, contact properties of the external electrode with internal electrodes may be decreased, and a defect such as blisters may occur, such that contact properties of the external electrode with a body may also be decreased.

Therefore, research has been conducted into an external electrode having improved contact properties with internal electrodes and a body having a small size and high capacitance.

SUMMARY

Contact properties of an external electrode with internal electrodes and a body may be deteriorated by a delamination or an aggregation phenomenon due to glass contained in the external electrode.

An exemplary embodiment in the present disclosure provides an electronic component capable of improving contact properties of external electrodes with internal electrodes and a body, and a manufacturing method thereof.

According to an exemplary embodiment in the present disclosure, an electronic component includes external electrodes formed on an external surface of a body to be electrically connected to internal electrodes, where the external electrodes contain metal particles and glass, wherein the metal particles include particles having a polyhedral shape, such that contact properties of the external electrodes with the internal electrodes and the body may be improved, and thus, electrical connectivity between the electrodes and mechanical strength of the external electrodes may be improved.

BRIEF DESCRIPTION OF THE DRAWINGS

The above and other aspects, features, and advantages of the present disclosure will be more clearly understood from the following detailed description taken in conjunction with the accompanying drawings, in which.

DETAILED DESCRIPTION

Figure 1:
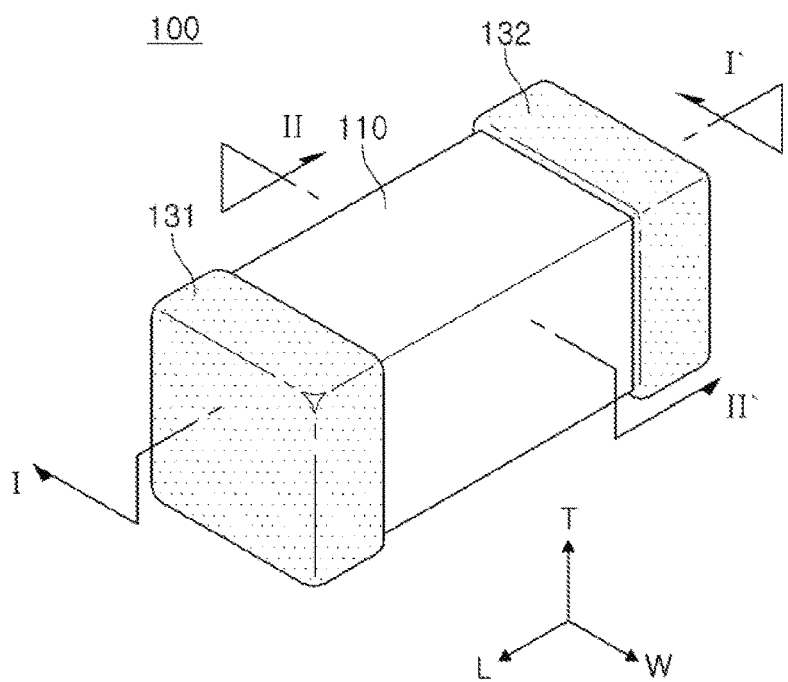
FIG. 1 is a schematic perspective view of an electronic component according to an exemplary embodiment in the present disclosure.

Hereinafter, an electronic component according to the present disclosure will be described with reference to the accompanying drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship relative to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Figure 2:
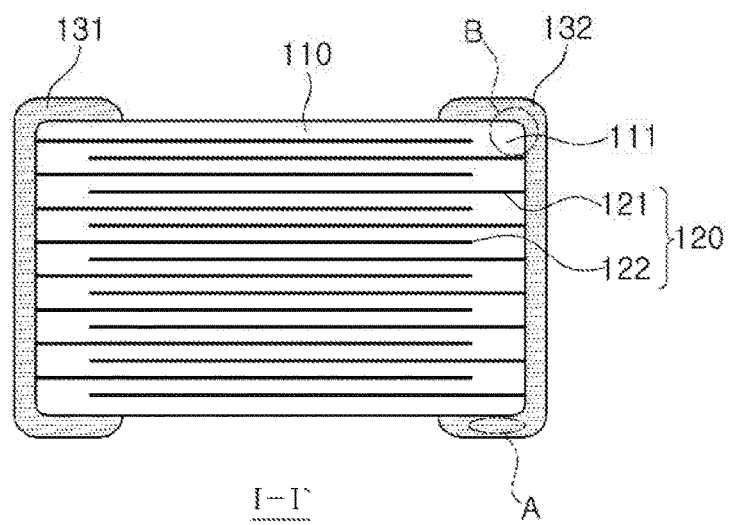
FIG. 2 is a schematic cross-sectional view of the electronic component according to the exemplary embodiment in the present disclosure, taken along line I-I' of FIG. 1.
Figure 3:
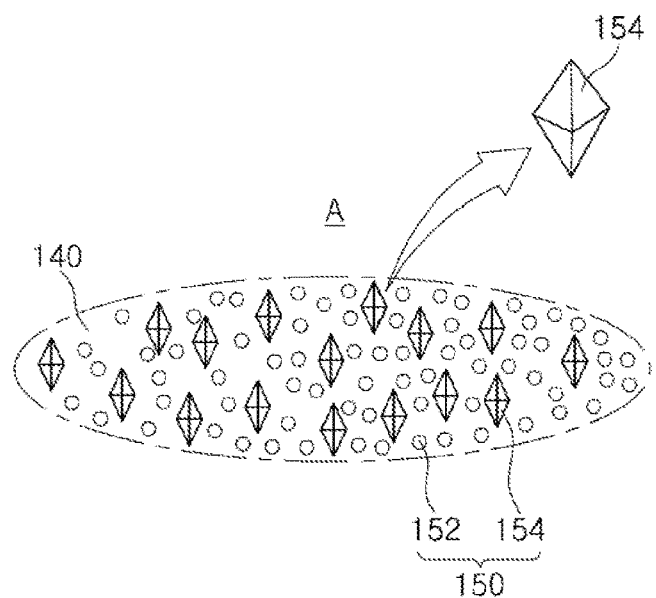
FIG. 3 is a schematic enlarged view of part A of FIG. 2.
Figure 4:
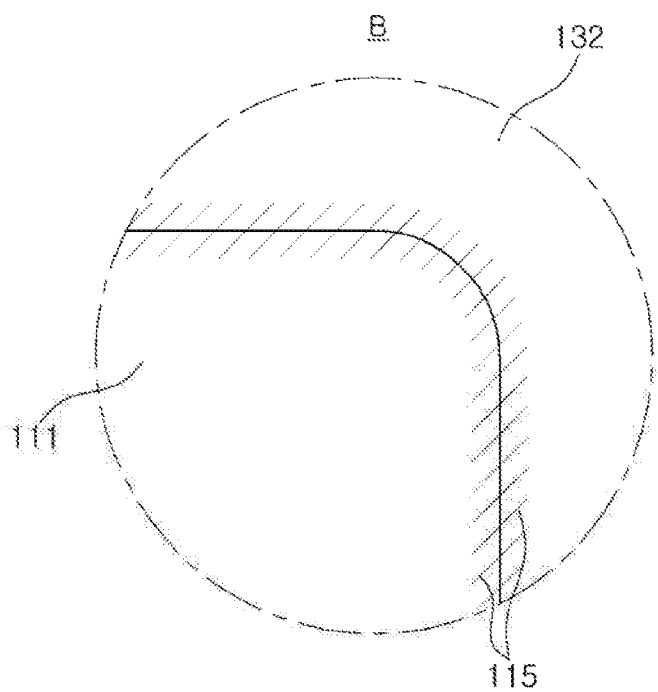
FIG. 4 is a schematic enlarged view of part B of FIG. 2.

FIG. 1 is a schematic perspective view of an electronic component according to an exemplary embodiment in the present disclosure, FIG. 2 is a schematic cross-sectional view of the electronic component according to the exemplary embodiment in the present disclosure, taken along line I-I' of FIG. 1, FIG. 3 is a schematic enlarged view of part A of FIG. 2, and FIG. 4 is a schematic enlarged view of part B of FIG. 2.

Referring to FIGS. 1 through 4, the electronic component 100 according to the present exemplary embodiment may include a body including a plurality of dielectric layers and internal electrodes, and external electrodes formed on an external surface of the body to be electrically connected to the internal electrodes and containing metal particles and glass, wherein the metal particles include particles having a polyhedral shape.

The body 110 may be formed by stacking a plurality of dielectric layers 111.

The plurality of dielectric layers configuring the body 110 may be in a sintered state, and adjacent dielectric layers may be integrated with each other so that boundaries therebetween may not be readily apparent to the naked eye.

The dielectric layer 111 may contain a ceramic material.

The ceramic material, a material having high permittivity, may be a perovskite material. The perovskite material may be a barium titanate ($BaTiO_3$)-based material, a strontium titanate ($SrTiO_3$)-based material, or the like, but is not limited thereto.

Internal electrodes 120 may be formed in the body 110.

The internal electrodes 120 may include a first internal electrode 121 having a first polarity and a second internal electrode 122 having a second polarity in pairs, and be disposed to face each other with respective dielectric layers interposed therebetween.

The first and second internal electrodes 121 and 122 may be exposed to first and second end surfaces of a body 110, respectively, to thereby be electrically connected to external electrodes 131 and 132, respectively.

The internal electrodes 120 may contain a conductive metal.

The conductive metal may be nickel (Ni), copper (Cu), palladium (Pd), or alloys thereof, but is not limited thereto.

The external electrodes 131 and 132 include a first external electrode 131 formed on a first end surface of the body 110 to be electrically connected to the first internal electrode 121 exposed to the first end surface of the body 110 and a second external electrode 132 formed on the second end surface of the body 110 to be electrically connected to the second internal electrode 122 exposed to the second end surface of the body 110.

The external electrodes 131 and 132 may be formed on the first and second end surfaces of the body 110 to be connected to the first and second internal electrodes 121 and 122, respectively.

Furthermore, the external electrodes 131 and 132 may extend to one or more of upper and lower surfaces and both side surfaces of the body 110 connecting the first and second end surfaces thereof.

Therefore, the external electrodes 131 and 132 may be formed to enclose portions of both side surfaces and portions of the upper and lower surfaces of the body 110 while being connected to the internal electrodes exposed to the first and second end surfaces of the body 110.

The first and second external electrodes 131 and 132 may contain metal particles and glass.

The metal particles may be formed of nickel (Ni), copper (Cu), or alloys thereof, but is not limited thereto.

A content of the glass may be 5 to 10%, based on a total content of the metal particles.

The first and second external electrodes may be formed of a paste for an external electrode containing a metal powder and glass.

A content of the metal powder for preparing the paste for an external electrode may be variously determined in the present disclosure, but is not particularly limited.

In general, external electrodes of an electronic component may be formed using a paste containing a metal powder and glass, wherein the glass may be softened during the sintering after applying the paste to thereby serve to firmly bond the external electrodes to the body and to seal distal ends of the body to which internal electrodes are exposed.

However, there is a difference in performance depending on the type of glass or an amount of added glass. When the physical properties of the glass contained in the paste for an external electrode are deteriorated, the following problems may occur: 1) a region in which the glass does not exist between the external electrodes and the body may be formed during the sintering after applying the paste, such that bonding strength may be weakened, 2) when an empty space formed between the metal powder particles is not filled with the glass, a plating solution may infiltrate through the space during the plating, thereby deteriorating reliability, and 3) when air bubbles or pores are formed in the glass, compactness of a predetermined level or more may not be implemented, such that equivalent series resistance (ESR) may be increased.

The external electrodes 131 and 132 of the electronic component 100 according to the present disclosure may contain glass 140 containing an oxide of at least one of vanadium (V) and manganese (Mn) and metal particles 150 including particles 154 having a polyhedral shape. Therefore, contact properties between the metal particles in the first and second external electrodes and electrical connectivity between the internal electrodes and the external electrodes may be improved due to an increase in surface area of the metal particles.

The particles may be formed of a metal material of a cubic system and have a crystalline shape such as a hexahedron, an octahedron, a dodecahedron, an octadecahedron, and the like. A shape of the particles may be changed depending on a growth orientation of the particles, but is not limited thereto.

In detail, the glass 140 may contain an oxide or carbonate of at least one of lithium (Li), potassium (K), and barium (Ba), an oxide of at least one of calcium (Ca), zinc (Zn), and aluminum (Al), an oxide of at least one of boron (B) and silicon (Si), and an oxide of at least one of vanadium (V) and manganese (Mn).

When the glass contains the oxide of at least one of vanadium (V) and manganese (Mn), during the sintering of the paste for an external electrode, a metal powder may be dissolved in a high temperature region and then reprecipitated as metal particles in a low temperature region.

That is, the first and second external electrodes 131 and 132 may contain the metal particles 150 and the glass 140 by the sintering.

As illustrated in FIG. 3, the external electrodes of the electronic component 100 according to the present disclosure may contain the metal particles 150 including particles 154 having an octahedral shape.

The metal particles may be formed of nickel (Ni), copper (Cu), or alloys thereof.

The metal particles 150 may include particles 152 having at least one shape of a spherical shape and a flake shape and the particles 154 having the octahedral shape.

The particles 154 having the octahedral shape may grow in the glass in a predetermined crystal orientation during the sintering to thereby have the octahedral shape. Therefore, the contact properties between the metal particles in the first and second external electrodes and electrical connectivity between the internal electrodes and the external electrodes may be improved, and a defect by blisters of the glass may be suppressed.

Referring to FIG. 4, the electronic component 100 according to the present disclosure may include a diffusion layer 115 in which the glass is diffused in a region of the body contacting the external electrodes 131 and 132.

The diffusion layer 115 may be formed by a reaction between the glass contained in the external electrodes and the ceramic material of the dielectric layers 111 configuring the body during the sintering.

The diffusion layer 115 may contain a Ba—V—O-based secondary phase containing the glass and the ceramic material, wherein the secondary phase may have an acicular shape.

The diffusion layer may be formed, such that the contact properties between the external electrodes and the body may be improved. Furthermore, the contact properties between the internal electrodes depressed in the body and the external electrodes may be improved.

Hereinafter, a manufacturing method of an electronic component according to the present disclosure will be described.

The manufacturing method of an electronic component according to an exemplary embodiment in the present disclosure may include forming a body including a plurality of dielectric layers and internal electrodes, applying a paste for an external electrode containing a metal powder and a glass composition onto an external surface of the body, sintering the body onto which the paste for an external electrode is applied, and obtaining the body on which external electrodes containing metal particles and glass are formed, wherein the metal particles include particles having polyhedral shape.

First, the plurality of dielectric layers may be prepared.

The dielectric layer may be formed of slurry containing a ceramic material, an organic solvent, and an organic binder.

The ceramic material, a material having high permittivity, may include a perovskite material. The perovskite material may be a barium titanate ($BaTiO_3$)-based material, a strontium titanate ($SrTiO_3$)-based material, or the like, but is not limited thereto.

Next, an internal electrode pattern may be formed on the dielectric layer.

The internal electrode pattern may be formed by printing a conductive paste containing a conductive metal.

As the conductive metal, a material having excellent electric conductivity may be used. For example, the conductive metal may include nickel (Ni), copper (Cu), palladium (Pd), or alloys thereof, but is not limited thereto.

The internal electrode pattern may be printed on the dielectric layer using the conductive paste by a printing method such as a screen printing method or a gravure printing method.

A body may be formed by alternately stacking the dielectric layers on which the internal electrode pattern is formed and sintering the stacked dielectric layers.

Next, the paste for an external electrode containing the metal powder and the glass may be applied onto the external surface of the body.

The metal powder may be formed of nickel (Ni), copper (Cu), or alloys thereof, and may have at least one shape of a spherical shape and a flake shape.

The glass used in the paste for an external electrode is a composition in which various oxides are mixed with each other, and according to the exemplary embodiment of the present disclosure, in order to solve the above-mentioned problems, the kinds or composition ratios of oxides contained in the glass may be adjusted.

In detail, according to the exemplary embodiment in the present disclosure, the glass contained in the paste for an external electrode may contain a (Li, K, Ba)-b(Ca, Zn, Al)-c(Si, B)-d(V, Mn) (a+b+c+d=100), wherein (Li, K, Ba) is an oxide or carbonate of at least one of lithium (Li), potassium (K), and barium (Ba), (Ca, Zn, Al) is an oxide of at least one of calcium (Ca), zinc (Zn), and aluminum (Al), (Si, B) is an oxide of at least one of silicon (Si) and boron (B), and (V, Mn) is an oxide of at least one of vanadium (V) and manganese (Mn).

Based on the overall glass composition, a may be a molar ratio of the oxide or carbonate of at least one of lithium (Li), potassium (K), and barium (Ba), b may be a molar ratio of the oxide of at least one of calcium (Ca), zinc (Zn), and aluminum (Al), c may be a molar ratio of the oxide of at least one of silicon (Si) and boron (B), and d may be a molar ratio of the oxide of at least one of vanadium (V) and manganese (Mn).

According to the exemplary embodiment in the present disclosure, a, b, c, and d may satisfy 5 (mol %)≤a≤30 (mol %), 19 (mol %)≤b≤31 (mol %), 25 (mol %)≤c≤60 (mol %), and 2 (mol %)≤d≤15 (mol %), respectively.

That is, based on the overall glass composition, the molar ratio of the oxide or carbonate of at least one of lithium (Li), potassium (K), and barium (Ba) may be 5 mol % to 30 mol %, the molar ratio of the oxide of at least one of calcium (Ca), zinc (Zn), and aluminum (Al) may be 19 mol % to 31 mol %, the molar ratio of the oxide of at least one of silicon (Si) and boron (B) may be 25 mol % to 60 mol %, and the molar ratio of the oxide of at least one of vanadium (V) and manganese (Mn) may be 2 mol % to 15 mol %.

According to the exemplary embodiment in the present disclosure, in a case in which a, b, c, and d satisfy 5 (mol %)≤a≤30 (mol %), 19 (mol %)≤b≤31 (mol %), 25 (mol %)≤c≤60 (mol %), and 2 (mol %)≤d≤15 (mol %), respectively, the glass, advantageous in implementing compactness due to high wettability for the metal powder, may be uniformly fused during the sintering to thereby firmly bond the external electrodes to the body, and may hermetically seal end surfaces of a body on which external electrodes are formed, and a paste for an external electrode containing the glass having the composition may be provided.

Lithium (Li), potassium (K), and barium (Ba) may be oxides such as $Li_2O$, $K_2O$, and BaO or carbonates such as $Li_2CO_3$, $K_2CO_3$, and $BaCO_3$, respectively.

The oxide or carbonate of at least one of lithium (Li), potassium (K), and barium (Ba) may be contained in a content of 5 mol % to 30 mol %, based on the overall glass composition.

In a case in which the content of the oxide or carbonate of at least one of lithium (Li), potassium (K), and barium (Ba) is less than 5 mol %, among glass composition ingredients, a modifier may be insufficient, such that Ts/Twet, a ratio of a softening point Ts to a wetting temperature Twet of the glass, may be increased, and in a case in which the content is more than 30 mol %, acid resistance of the glass may be deteriorated, such that the external electrodes may be easily eroded by a plating solution.

The wetting temperature Twet means a temperature at which after softening a pellet manufactured using a glass powder on a substrate by raising a temperature, an angle between the softened pellet and the substrate becomes 90°.

The oxide of at least one of calcium (Ca), zinc (Zn), and aluminum (Al) may be CaO, ZnO, or $Al_2O_3$.

The oxide of at least one of calcium (Ca), zinc (Zn), and aluminum (Al) may be contained in a content of 19 to 31 mol %, based on the overall glass composition.

In a case in which the content of the oxide of at least one of calcium (Ca), zinc (Zn), and aluminum (Al) is in a content of 19 to 31 mol %, wettability of the glass for the metal powder may be increased, such that pores existing in the paste for an external electrode may be squeezed outside the paste for an external electrode, which may be advantageous in implementing compactness.

In a case in which the content of the oxide of at least one of calcium (Ca), zinc (Zn), and aluminum (Al) is less than 19 mol %, a content of a secondary modifier oxide is insufficient, such that compactness of a predetermined level or more may not be implemented, and in a case in which the content is more than 31 mol %, a phase separation phenomenon may occur due to an excessive amount of the secondary modifier oxide, such that the glass composition may be partially non-uniform, and thus, bonding strength of a predetermined level or more may not be implemented.

The oxide of silicon (Si) and boron (B) may be $SiO_2$ and $B_2O_3$.

The oxide of at least one of silicon (Si) and boron (B) serving a network former in the glass may be contained in a content of 25 to 60 mol %, based on the overall glass composition.

In a case in which the content of the oxide of at least one of silicon (Si) and boron (B) is less than 25 mol %, stability of a glass phase may be deteriorated, such that a devitrification phenomenon may occur, and in the case in which the content is more than 60 mol %, a temperature at which the glass forms a liquid phase may be increased, such that a suitable liquid phase may not be implemented at an electrode sintering temperature.

The oxide of vanadium (V) and manganese (Mn) may be $V_2O_5$ and MnO.

The oxide of at least one of vanadium (V) and manganese (Mn) may be contained in a content of 2 to 15 mol %, based on the overall glass composition.

In a case in which the content of the oxide of at least one of vanadium (V) and manganese (Mn) is less than 2 mol %, it is difficult to improve high-temperature flowability of the glass, and in a case in which the content is more than 15 mol %, stability of the glass phase may be deteriorated, such that the devitrification phenomenon may occur.

TABLE 1

| Experimental Example | Content (mol %) of Ingredient Based on 100 mol % of Overall Glass | | | | | | | | | | Softening point (Ts, °C.) of Glass | Wetting Temperature (Twet, °C.) of Glass |
|---|---|---|---|---|---|---|---|---|---|---|---|---|
| | A | | | b | | | c | | d | | | |
| | $Li_2O$ | $K_2O$ | BaO | CaO | ZnO | $Al_2O_3$ | $B_2O_3$ | $SiO_2$ | $V_2O_5$ | MnO | | |
| 1 | 14.4 | 6.2 | 8.2 | 2.6 | 16.8 | 1.2 | 23.5 | 17.9 | 6.2 | 3.0 | 522 | 675 |
| 2 | 14.4 | 6.2 | 8.2 | 2.6 | 16.8 | 1.2 | 23.5 | 14.9 | 6.2 | 6.0 | 519 | 665 |
| 3* | 14.4 | 6.2 | 8.2 | 2.6 | 16.8 | 1.2 | 23.5 | 25.9 | 1.0 | — | 563 | 733 |
| 4 | 14.4 | 6.2 | 8.2 | 2.6 | 16.8 | 1.2 | 23.5 | 23.9 | 3.2 | — | 548 | 704 |
| 5 | 14.4 | 6.2 | 8.2 | 2.6 | 16.8 | 1.2 | 23.5 | 20.9 | 6.2 | — | 531 | 689 |
| 6 | 14.4 | 6.2 | 8.2 | 2.6 | 16.8 | 1.2 | 23.5 | 17.9 | 9.2 | — | 515 | 650 |
| 7 | 14.4 | 6.2 | 8.2 | 2.6 | 16.8 | 1.2 | 23.5 | 14.9 | 12.2 | — | 488 | 600 |
| 8* | 14.4 | 6.2 | 8.2 | 2.6 | 16.8 | 1.2 | 23.5 | 11.9 | 15.2 | — | 480 | 533 |
| 9 | 14.4 | 6.2 | 8.2 | 2.6 | 16.8 | 1.2 | 23.5 | 20.9 | — | 6.2 | 543 | 717 |
| 10* | 7.0 | 3.0 | 2.0 | 5.0 | 20.0 | 5.0 | 35.0 | 20.0 | 1.5 | 1.5 | 606 | 782 |
| 11 | 7.0 | 3.0 | 2.0 | 5.0 | 22.0 | 5.0 | 30.0 | 20.0 | 3.0 | 3.0 | 613 | 702 |
| 12 | 7.0 | 3.0 | 2.0 | 5.0 | 22.0 | 5.0 | 25.0 | 25.0 | 3.0 | 3.0 | 596 | 714 |
| 13 | 7.0 | 3.0 | 2.0 | 5.0 | 22.0 | 5.0 | 25.0 | 28.0 | 3.0 | 3.0 | 597 | 709 |
| 14 | 7.0 | 3.0 | 2.0 | 3.0 | 22.0 | 3.0 | 22.0 | 28.0 | 5.0 | 5.0 | 575 | 692 |
| 15 | 5.0 | 2.0 | 2.0 | 5.0 | 22.0 | 5.0 | 25.0 | 25.0 | 6.0 | 3.0 | 592 | 701 |
| 16 | 3.5 | 1.5 | 2.0 | 5.0 | 21.0 | 5.0 | 30.0 | 20.0 | 6.0 | 6.0 | 607 | 689 |
| 17 | 3.5 | 1.5 | 5.0 | 5.0 | 21.0 | 5.0 | 30.0 | 20.0 | 6.0 | 3.0 | 608 | 699 |
| 18* | 1.0 | 1.0 | 2.0 | 5.0 | 27.0 | 5.0 | 30.0 | 23.0 | 3.0 | 3.0 | 657 | 791 |
| 19* | 1.0 | 1.0 | 2.0 | 5.0 | 27.0 | 5.0 | 30.0 | 24.0 | 2.5 | 2.5 | 658 | 812 |

*Comparative Example

Table 1 illustrates a softening point (softening point, Ts) of the glass and a wetting temperature of the glass depending on the glass composition.

Here, the softening point Ts means a temperature when deformation is rapidly removed at a temperature at which a viscosity becomes a predetermined level, and the wetting temperature Twet means a temperature at which after softening a pellet manufactured using glass on a copper (Cu) substrate by raising a temperature, an angle between the softened pellet and the substrate becomes 90°.

The lower the softening point, the more advantageous in low-temperature sintering, and the lower the wetting temperature, the more excellent the wettability with copper (Cu).

Hereinafter, the glass composition of Table 1 will be represented by a(Li, K, Ba)-b(Ca, Zn, Al)-c(Si, B)-d(V, Mn) and described.

Referring to [Table 1], it may be appreciated that in Comparative Examples, a content of the composition was not in a content range of the composition according to the present disclosure, the softening point and the wetting temperature were high.

In particular, in Experimental Example 3, since the content of d was 1.0 unlike Inventive Example of the present disclosure, the softening point was not high, but since the wetting temperature was high, wettability with copper was low, such that a compact microstructure may not be obtained after electrode sintering. Further, since the content of d was low, it may not be easy to reprecipitate the metal particles.

In Experimental Example 8, the content of d was high (15.2) and thus, the softening point and the wetting temperature were low. However, since the wetting temperature was excessively low, a state in which the metal was dissolved in the glass may be maintained in a low-temperature region during the sintering, and thus it may not be easy to reprecipitate the metal particles.

The paste for an external electrode containing the glass according to the present disclosure is applied to the body and then sintered, but in the glass, the metal powder may be dissolved in a high temperature region during the sintering, and then, the dissolved metal material may be partially reprecipitated as particles in the low temperature region.

Flowability of the glass at a high temperature may be decreased due to the reprecipitated particles, thereby suppressing a blister from occurring between the external electrodes and the body.

The reason is that solubility of the metal powder may be changed due to a change in oxidation number of the glass caused by the oxide of at least one of vanadium (V) and manganese (Mn) among the glass ingredients, and solubility of the metal was high in the high temperature region during the sintering, but the solubility of the metal was decreased in the low temperature region, such that the dissolved metal was partially reprecipitated with a predetermined crystal orientation.

The reprecipitated particles may grow in the predetermined crystal orientation and have an octahedral shape. The external electrodes formed after the sintering may contain the metal particles including the particles having the octahedral shape and the glass.

The metal particles of the external electrodes may be uniformly positioned by dissolving the metal powder and then allow the metal powder to be reprecipitated as the metal particles, such that the contact properties between the metal particles may be improved, and thus, mechanical strength may be improved due to an increase in compactness of the external electrodes.

Further, since the metal particles are reprecipitated from the glass phase in which the metal powder is dissolved, a delamination phenomenon of the glass may be prevented, such that a plating defect occurring during the plating after sintering the external electrodes may be decreased.

The glass may be reacted with the ceramic material of the body during the sintering.

The glass may be diffused to a region contacting the body by the reaction between the glass and the ceramic material. Therefore, the contact properties between the external electrodes and the internal electrodes in the body may be improved.

According to the exemplary embodiment in the present disclosure, at the time of forming the external electrodes, a high degree of compactness may be implemented by intensifying performance of the glass contained in the paste for an external electrode, such that external electrodes having corrosion resistance against a plating solution hermetically sealing the end surface of the body, having excellent equivalent series resistance (ESR) characteristics due to improvement of adhesion of the external electrodes with the internal electrodes and the body may be provided.

The glass may be contained in a form of glass frit, and a size of the glass may be suitably adjusted in order to simultaneously obtain an effect of intensifying corrosion resistance against the plating solution while having excellent wettability with the metal powder, particularly, copper (Cu). An average particle size of the glass frit may be 0.5 μm to 5 μm.

A content of the glass may be variously changed depending on the object of the present disclosure. For example, the glass may be contained in a content of 5 to 10%, based on a content of the metal powder.

In a case in which the content of the glass is less than 5%, based on the content of the metal powder, an effect of preventing infiltration of the plating solution to improve reliability of the electronic component may be insufficient, and in a case in which the content is more than 10%, at the time of melting the glass, phase-separation may occur.

As set forth above, according to exemplary embodiments in the present disclosure, the electronic component may include the external electrodes containing copper particles having the polyhedral shape, and thus, the contact properties of the external electrodes with the internal electrodes and the body may be improved.

While exemplary embodiments have been shown and described above, it will be apparent to those skilled in the art that modifications and variations could be made without departing from the scope of the present invention as defined by the appended claims.

What is claimed is:

1. A manufacturing method of an electronic component, the manufacturing method comprising steps of:
    forming a body including first and second internal electrodes respectively exposed from first and second end surfaces of the body and dielectric layers disposed between the first and second internal electrodes;
    applying, on the first and second end surfaces of the body, a paste containing a metal powder and a first glass containing a (Li, K, Ba)-b(Ca, Zn, Al)-c(Si, B)-d(V, Mn) (a+b+c+d=100 (mol %), in which 5 (mol %)≤a≤30 (mol %), 19 (mol %)≤b≤31 (mol %), 25 (mol %)≤c≤60 (mol %), and 2 (mol %)≤d≤15 (mol %), where (Li, K, Ba) is an oxide or carbonate of at least one of lithium (Li), potassium (K), and barium (Ba), (Ca, Zn, Al) is an oxide of at least one of calcium (Ca), zinc (Zn), and aluminum (Al), (Si, B) is an oxide of at least one of silicon (Si) and boron (B), and (V, Mn) is an oxide of at least one of vanadium (V) and manganese (Mn); and
    sintering the body and the paste applied on the first and second end surfaces of the body to convert the paste to first and second external electrodes including crystalline metal particles having a polyhedral shape and a second glass such that the first and second external electrodes are connected to the first internal electrodes and the second internal electrodes, respectively.

2. The manufacturing method of claim 1, wherein the sintering the body and the paste comprises converting the paste to the first and second external electrodes including the crystalline metal particles having an octahedral shape and the second glass.

3. The manufacturing method of claim 1, wherein the applying the paste on the first and second end surfaces of the body comprises preparing the paste including the metal powder including particles having at least one shape of a spherical shape and a flake shape and the first glass.

4. The manufacturing method of claim 1, wherein the applying the paste on the first and second end surfaces of the body comprises preparing the paste including the first glass containing an oxide of at least one of vanadium (V) and manganese (Mn) and the metal powder.

5. The manufacturing method of claim 1, wherein the sintering the body and the paste comprises dissolving the metal powder and reprecipitating the dissolved metal powder with a predetermined crystal orientation.

6. The manufacturing method of claim 1, wherein the sintering comprises diffusing the first glass of the paste to a region contacting the body.

7. The manufacturing method of claim 1, wherein the applying the paste on the first and second end surfaces of the body comprises preparing the paste including the metal powder made of nickel (Ni), copper (Cu), or alloys thereof and the first glass.

8. The manufacturing method of claim 1, wherein the applying the paste on the first and second end surfaces of the body comprises preparing the paste including the metal powder and the first glass having a content of 5 to 10%, based on an overall content of the metal powder.

\* \* \* \* \*